(12) United States Patent
Szarek (10) Patent No.: US 10,218,136 B2
(45) Date of Patent: *Feb. 26, 2019

(54) INTERCHANGEABLE INTERNAL MODULAR AVIONICS PLATFORM ASSEMBLY

(71) Applicant: The Boeing Company, Chicago, IL (US)

(72) Inventor: Kenneth Alan Szarek, Beaufort, SC (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/688,737

(22) Filed: Aug. 28, 2017

(65) Prior Publication Data

US 2018/0014432 A1 Jan. 11, 2018

Related U.S. Application Data

(63) Continuation of application No. 14/919,663, filed on Oct. 21, 2015, now Pat. No. 9,750,162.

(51) Int. Cl.
*B64C 1/00* (2006.01)
*B64D 47/00* (2006.01)
(Continued)

(52) U.S. Cl.
CPC .............. *H01R 27/02* (2013.01); *B64C 1/00* (2013.01); *B64D 43/00* (2013.01); *B64D 47/00* (2013.01);
(Continued)

(58) Field of Classification Search
CPC ... B64C 1/22; B60R 16/0238–16/0239; H05K 7/1412
See application file for complete search history.

(56) References Cited

U.S. PATENT DOCUMENTS 3,541,395 A 11/1970 Lucchino
3,689,128 A 9/1972 Andreini et al.
(Continued)

OTHER PUBLICATIONS

White, P. Scott et al., "F/A-18D (RC)/ATARS flight test update," Proc. SPIE 2555, Airborne Reconnaissance XIX, (Sep. 1, 1995); doi: 10.1117/12.218614 (Year: 1995) (best copy available).*
(Continued)

*Primary Examiner* — Robert J Hoffberg
(74) *Attorney, Agent, or Firm* — Kolisch Hartwell, P.C.

(57) ABSTRACT

Internal interchangeable modular avionics platform assemblies and methods for removably mounting and interchanging modular avionics platforms within an aircraft. In some embodiments, modular avionics platform assemblies may include a modular avionics platform configured to support various avionics equipment, suitable for removable mounting within a forward fuselage, and interchangeable with a number of alternate platforms. A platform may include a frame structure, and mounting pins and a connector assembly disposed on the frame structure. The mounting pins may project outwardly from the frame structure to align with and detachably secure to corresponding airframe members of an aircraft when the frame structure is in a mounted position. The connector assembly may be disposed on the frame structure and have a plurality of connectors, including connectors for alternating current, direct current, and data. In some embodiments, the platform may also include an environmental cooling system disposed on the frame structure.

18 Claims, 5 Drawing Sheets

(51) Int. Cl.
*H05K 7/14* (2006.01)
*H05K 7/20* (2006.01)
*H01R 27/02* (2006.01)
*G08C 17/02* (2006.01)
*H04L 29/08* (2006.01)
*B64D 43/00* (2006.01)
*H04W 84/18* (2009.01)

(52) U.S. Cl.
CPC ............ *G08C 17/02* (2013.01); *H04L 67/12* (2013.01); *H05K 7/1412* (2013.01); *H05K 7/20145* (2013.01); *H05K 7/20154* (2013.01); *H05K 7/20354* (2013.01); *B64C 2211/00* (2013.01); *H04W 84/18* (2013.01)

(56) References Cited

U.S. PATENT DOCUMENTS

| | | | |
|---|---|---|---|
| 3,891,288 A | | 6/1975 | Marquette |
| 3,904,937 A | | 9/1975 | Levin |
| 4,043,524 A | * | 8/1977 | Dreyer ............... B64D 9/00 206/3 |
| 4,044,974 A | * | 8/1977 | Lingley ............... B64G 1/14 206/319 |
| 4,082,240 A | * | 4/1978 | Heathman ............ B64G 1/14 206/319 |
| 4,153,225 A | * | 5/1979 | Paulsen ............. H05K 7/20572 244/118.1 |
| 4,290,570 A | * | 9/1981 | Smolik ............... B64G 1/22 244/118.1 |
| 4,324,374 A | * | 4/1982 | Wittmann ........... B64G 1/641 244/173.3 |
| 4,395,005 A | * | 7/1983 | Ganssle .............. B64G 1/64 244/118.1 |
| 4,458,296 A | * | 7/1984 | Bryant .............. H05K 7/20009 361/691 |
| 5,298,045 A | | 3/1994 | Whitson et al. |
| 5,353,216 A | | 10/1994 | Ayers et al. |
| 6,410,995 B1 | | 6/2002 | Grouse et al. |
| 6,450,822 B1 | | 9/2002 | Eller |
| 6,572,376 B1 | | 6/2003 | Saunders |
| 6,797,879 B2 | | 9/2004 | Leyda et al. |
| 6,905,097 B2 | * | 6/2005 | Blackwell-Thompson ................ B64C 1/20 244/173.1 |
| 9,019,719 B2 | | 4/2015 | Tomasi et al. |
| 9,221,532 B2 | * | 12/2015 | Karem ................ B64C 1/0009 |
| 9,493,226 B2 | * | 11/2016 | Karem ................ B64C 1/0009 |
| 9,750,162 B2 | * | 8/2017 | Szarek ................ H01R 27/02 |
| 2006/0219094 A1 | * | 10/2006 | Padan ................ B64D 7/06 89/37.16 |
| 2016/0176537 A1 | | 6/2016 | Rodriguez |
| 2017/0050739 A1 | * | 2/2017 | Jon ..................... B64D 41/00 |

OTHER PUBLICATIONS

Stroot, et al., Fitting Modular Reconnaissance Systems Into Modern High Performance Aircraft, SPIE vol. 1342 Airborne Reconnaissance XIV, pp. 230-242, URL: http://proceedings.spiedigitallibrary.org, 1990, 13 pages.

Heinz, David et al., F/A-18 Tactical Reconnaissance (TAC RECCE) Capability, Proc. SPIE 2829, Airborne Reconnaissance XX, 58 (Nov. 21, 1996); doi:10.1117/12.259750, 18 pages.

Naval Air Warfare Center, Weapons Department, ATARS Equipped Hornet Returns from Kosovo with WD Team, URL: http://fas.org/irp/program/collect/docs/990908-atars.htm, Sep. 8, 1999, 2 pages.

FAS Intelligence Resource Program, Advanced Tactical Airborne Reconnaissance System (ATARS), URL: http://fas.org/irp/program/collect/atars.htm, Jun. 28, 2000, 4 pages.

Rindt, Gina, Hawks take Advanced Tactical Airborne Reconnaissance System to next level, Mar. 5, 2009, 2 pages downloaded from https://www.dvidshub.net/news/printable/31191 on Apr. 2, 2017.

Paone, Chuck, Center Team Works to Connect New Fighters, Bomber, 66th Air Base Wing Public Affairs, Air Force Print News Today, URL: http://www.hanscom.af.mil/news/story_print.asp?id=123143282, Apr. 7, 2009, 2 pages.

Mehta, Aaron, New Data Link Enables Stealthy Comms, URL: http://www.defensenews.com/article/20130714/DEFFEAT01/307140011/New-Data-Link-Enables-Stealthy-Comms, Jul. 14, 2013, 2 pages.

Marine Aviation Plan 2015, URL: https://marinecorpsconceptsandprograms.com/concepts/service-campaign-plan-2014-2022/2015-aviation-plan, Last revised Nov. 18, 2014, 260 pages.

* cited by examiner

INTERCHANGEABLE INTERNAL MODULAR AVIONICS PLATFORM ASSEMBLY

CROSS-REFERENCE TO RELATED APPLICATION

This application is a continuation application of U.S. patent application Ser. No. 14/919,663, filed Oct. 21, 2015. The complete disclosure of the above-identified patent application is hereby incorporated by reference for all purposes.

FIELD

This disclosure relates to interchangeable modular avionics platform assemblies and methods for removably mounting and interchanging modular avionics platforms within an aircraft. More specifically, the disclosed embodiments relate to modular avionics platforms configured to support various avionics equipment, suitable for removable mounting within a forward fuselage of an aircraft, and interchangeable with a number of alternate modular avionics platforms.

BACKGROUND

For various reasons, it may be desirable to modularly install selected avionics equipment onto an aircraft. Conventional solutions for modular installation of avionics equipment include removably mounting an equipment "pod" to an exterior of the aircraft. Various equipment pods may be specialized to perform a variety of equipment-dependent missions, e.g., reconnaissance, electronic jamming, etc., and include sets of avionics equipment pertaining to those missions. For example, an equipment pod suitable for reconnaissance missions may include various cameras and sensors, and may be temporarily mounted on a lower exterior portion of the aircraft. Although the equipment pod may be suitable for meeting mission objectives, external mounting of the equipment pods may be problematic and thus undesirable.

For example, an externally mounted equipment pod may add unwanted bulk to the aircraft, which may adversely affect performance of the aircraft, such as by reducing cruise speed. Accordingly, flight testing may be required to measure any adverse effects the equipment pod may have on aircraft performance. Additionally, external mounting of the equipment pods may be an inefficient use of storage space on the aircraft, such as by occupying external stores of the aircraft instead of utilizing existing internal stores of the aircraft. Moreover, the equipment pods may have limited modularity, i.e., be difficult to customize, in that addition and/or removal of avionics equipment from the pod may be difficult. In other words, the equipment pods may not be fully customizable to meet the needs of any equipment-dependent mission.

A custom reconnaissance assembly having imaging devices for use during reconnaissance missions also exists that replaces a gun assembly in a forward gun bay of certain aircraft. This assembly uses mounting assemblies including fixed or pivot pins with slotted plates or clamp assemblies to secure it to the aircraft airframe. This assembly is not available for different types of aircraft and is limited to the single use of reconnaissance.

SUMMARY

The present disclosure relates to interchangeable modular avionics platform assemblies and methods for removably mounting and interchanging modular avionics platforms within a forward fuselage of an aircraft. In some embodiments, the disclosed assemblies may include a modular avionics platform suitable for removable mounting within the forward fuselage and interchangeable with a number of alternate modular avionics platforms, wherein each platform includes a frame structure, at least one pair of mounting pins disposed on the frame structure, and a connector assembly disposed on the frame structure. The frame structure may have substantially parallel opposing side portions spaced apart at a predetermined width so that the frame structure fits between opposing airframe members within a forward interior bay of a fuselage of an aircraft with each side portion proximate a corresponding airframe member. Each of the at least one pair of mounting pins may be disposed on and axially aligned with a respective one of the opposing side portions of the frame structure and configured to project outwardly from each respective opposing side portion to align with and detachably secure to the corresponding airframe member when the frame structure is in a mounted position. The connector assembly may be disposed on the frame structure and have a plurality of connectors, including an alternating current connector configured to connect to a 115-volt alternating current source, a direct current connector configured to connect to a 28-volt direct current source, and a data bus connector configured to connect to a data bus of the aircraft. Additionally, some embodiments may include an environmental cooling system disposed on the frame structure. The modular avionics platform may be mountable within and non-destructively releasably removable from the forward interior bay of the fuselage as to be interchangeable with a number of alternate modular avionics platforms, with each modular avionics platform being configured to support one or more of avionics equipment having different dimensions, and to thereby enable modular installation of selected avionics equipment into the aircraft to perform a variety of equipment-dependent missions.

In some embodiments, an aircraft may have a fuselage with a forward interior bay having laterally opposing airframe members and configured for removable mounting of a gun therein. An interchangeable modular avionics platform may be removably mounted to the airframe members within the forward interior bay. The platform may include a substantially rectangular frame structure having opposing side portions proximate to the airframe members. The frame structure may include a plurality of outwardly projecting mounting pins disposed on and axially aligned with the side portions, including a first pair of mounting pins and a second pair of mounting pins spaced apart from the first pair of mounting pins. Each mounting pin may be positioned on the frame structure to align with and detachably secure to a corresponding clamp assembly disposed on the airframe members. A plurality of clamp assemblies may be disposed on the airframe members in positions corresponding to positions of the mounting pins on the frame structure. The plurality of clamp assemblies may include a first pair of clamp assemblies corresponding to the first pair of mounting pins and a second pair of clamp assemblies corresponding to the second pair of mounting pins. Each clamp assembly may be configured to detachably secure a corresponding mounting pin and have a fixed clamp element fixedly attached to a respective airframe member, and a pivot clamp element configured to pivot between an open position in which the corresponding mounting pin is not clamped, and a closed position in which the corresponding mounting pin is clamped into place relative to the clamp assembly. The modular avionics platform may be configured to be mountable within and non-destructively releasably removable from the forward interior bay of the fuselage by the plurality of clamp assemblies as to be interchangeable with a number of alternate modular avionics platforms. Each modular avionics platform may be configured to support one or more of avionics equipment having different dimensions, and to thereby enable modular installation of selected avionics equipment into the aircraft to perform a variety of equipment-dependent missions.

In some embodiments, a method may include removably mounting an interchangeable modular avionics platform within a forward interior bay of an aircraft, including attaching a plurality of clamp assemblies to opposing airframe members within the forward interior bay, disposing a plurality of mounting pins onto the platform to align with corresponding clamp assemblies, and detachably securing the mounting pins to the corresponding clamp assemblies.

Features, functions, and advantages may be achieved independently in various embodiments of the present disclosure, or may be combined in yet other embodiments, further details of which can be seen with reference to the following description and drawings.

DESCRIPTION

Overview

Various embodiments of an interchangeable modular avionics platform assembly and related methods are described below and illustrated in the associated drawings. Unless otherwise specified, the modular avionics platform assembly and/or its various components may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other avionics platform assemblies. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

General Features

Figure 1:
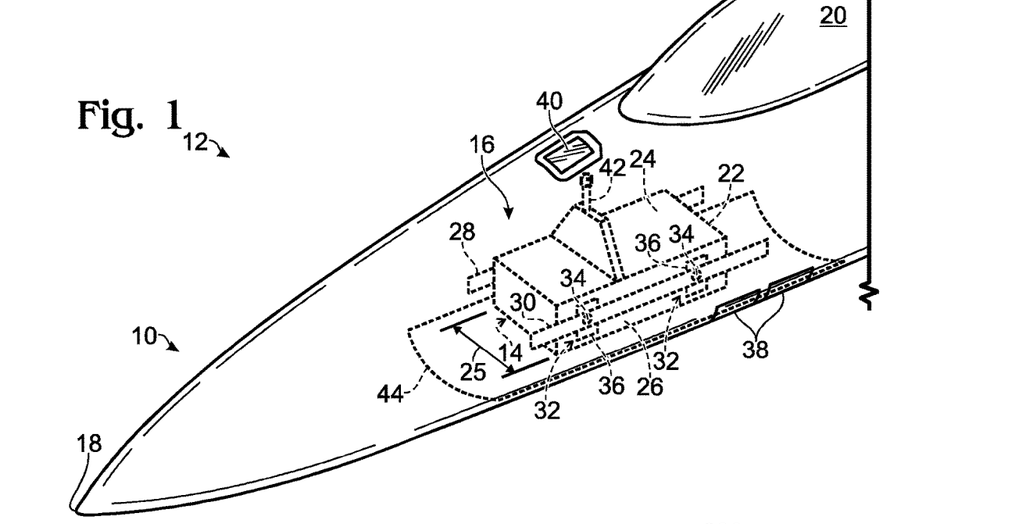
FIG. 1 is a perspective view of a front portion of an aircraft showing a forward interior bay in a fuselage of the aircraft, with an interchangeable modular avionics platform assembly disposed within the forward interior bay.

This section describes general features of interchangeable internal modular avionics platform assemblies; see FIG. 1.

FIG. 1 is a perspective view of a forward fuselage, generally indicated at 10, of an aircraft 12. An interchangeable modular avionics platform assembly 14 is disposed within a forward interior bay 16 of aircraft 12. Although only forward fuselage 10 of aircraft 12 is shown in FIG. 1, some embodiments may include an entire aircraft 12. Alternative embodiments may include only modular avionics platform assembly 14.

As shown in FIG. 1, forward interior bay 16 of forward fuselage 10 may be located substantially between a nose 18 and a cockpit 20 of aircraft 12, and may extend at least partially beneath cockpit 20. Forward interior bay 16 may be suitable for mounting of avionics equipment therein. For example, forward interior bay 16 may be a gun bay and suitable for mounting of a gun therein. In such embodiments, removal of the gun may provide space for modular installation of other selected avionics equipment. Specifically, modular avionics platform assembly 14 may be disposed within forward interior bay 16 to thereby enable modular installation of various avionics equipment within aircraft 12.

More specifically, platform assembly 14 may include a modular avionics platform 22, which may be mountable within and non-destructively releasably removable from interior bay 16 (i.e., non-destructively removably mounted) as to be interchangeable with a number of alternate modular avionics platforms. Additionally, each platform 22 may be configured to support one or more avionics equipment having different dimensions, to thereby enable modular installation of selected avionics equipment into aircraft 12 to perform a variety of equipment-dependent missions. Selected avionics equipment may include but are not limited to any suitable custom and/or commercial off-the-shelf devices such as cameras, data link systems, track and sensor systems, radio terminals, environmental cooling systems, and/or other weapon replacement assemblies. For example, platform 22 may house one or more cameras and supporting equipment for use in reconnaissance missions.

Regarding modularity of platform 22, any avionics equipment disposed on and/or within platform 22 may be interchangeable with any other suitable avionics equipment. More specifically, avionics equipment may be easily added to and/or removed from platform 22 so that one platform 22 may be a multipurpose platform 22, i.e., support different types of equipment for different types of equipment-dependent missions. Additionally or alternatively, multiple platforms 22 may be used, each platform being configured for a specific equipment-dependent mission or set of missions. In other words, one platform 22 may be interchangeable with any number of alternate platforms 22 to perform a variety of equipment-dependent missions.

Additionally, platform 22 may be configured to fit in any aircraft having a forward fuselage 10 that is or may be substantially hollow (e.g., have a gun bay from which the gun may be removed). As shown in FIG. 1, platform 22 may be substantially rectangular in shape and include opposite side portions 24 and 26 spaced apart at a width 25 corresponding to a distance between corresponding opposing airframe members 28 and 30 within forward interior bay 16 so that platform 22 may fit between airframe members 28 and 30. Airframe members 28 and 30 may provide a mechanical structure for aircraft 12 and be substantially parallel to a longitudinal axis (not shown) defined by a length of aircraft fuselage 10, as shown in FIG. 1. In some examples, airframe members 28 and 30 may be transverse or even substantially perpendicular to the longitudinal axis of aircraft fuselage 10. Additionally, as shown in FIG. 1, platform 22 may be removably mounted to airframe members 28 and 30.

As also shown in FIG. 1, embodiments of platform assembly 14 may generally include two mounting assemblies, shown generally at 32, for mounting platform 22 to airframe members 28 and 30. Each mounting assembly 32 may include a first mounting device 34 disposed on a side portion 24 or 26 to provide support for platform 22 by engagement with a complementary second mounting device 36 disposed on the corresponding one of airframe members 28 and 30. In some embodiments, aircraft 12 may be modified post-manufacture to include second mounting devices 36. In other embodiments, aircraft 12 may have been manufactured to include second mounting devices 36. Any suitable number of mounting assemblies 32 may be used.

Platform 22 may also include additional elements configured to correspond with certain components of aircraft 12. As shown in FIG. 1, such aircraft components may include one or more louvers 38, such as gun gas vents, blast diffuser vents, etc., located on one or more sides of forward fuselage 10 and configured to vent exhaust from within forward interior bay 16 to an exterior of aircraft 12. Aircraft components may also include an access window 40, such as a gun mount upper access, located on an upper portion of forward fuselage 10. Access window 40 is disposed to provide vertical support to a platform 22 by a hoist line extending through the window to a hoist knob 42 disposed on platform 22. Additional aircraft components may include one or more access panels 44, such as an equipment access door, located on a bottom of forward fuselage 10 and configured to enable insertion and/or removal of a gun assembly into and/or from forward interior bay 16. The locations of louver(s) 38, access window 40, and access panel(s) 44 shown in FIG. 1 are merely illustrative; different embodiments may or may not include these components, and they may be located in alternative and/or additional locations.

Modular avionics platform assemblies are discussed in more detail with respect to Example 1 below; and methods for mounting, non-destructively removing, and interchanging modular avionics platforms within aircraft 12 are discussed in more detail with respect to Example 2 below.

EXAMPLES, COMPONENTS, AND ALTERNATIVES

The following sections describe selected aspects of an exemplary interchangeable modular avionics platform assembly as well as related methods. The examples in these sections are intended for illustration and should not be interpreted as limiting the entire scope of the present disclosure. Each section may include one or more distinct inventions, and/or contextual or related information, function, and/or structure.

Interchangeable Internal Modular Avionics Platform Assemblies

This section describes specific features of interchangeable internal modular avionics platform assemblies; see FIGS. 2-6.

Example 1

Figure 2:
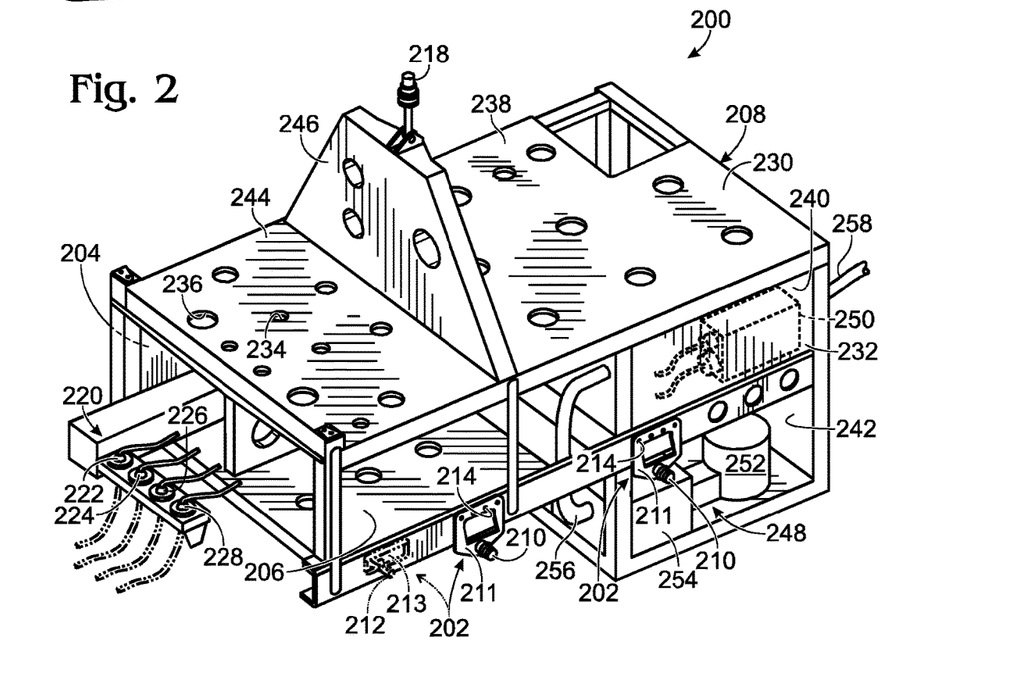
FIG. 2 is a top isometric view showing an interchangeable modular avionics platform including at least one pair of mounting pins disposed on opposing side portions of the platform.

FIG. 2 is a top isometric view showing an interchangeable modular avionics platform 200, including at least one pair of mounting devices 202 disposed on opposing side portions 204 and 206 of a frame structure 208. Platform 200 is an example of a platform 22 described above.

As shown in FIG. 2, side portions 204 and 206 may be substantially parallel and spaced apart at a predetermined width W so that frame structure 208 fits between opposing airframe members 28 and 30 within forward interior bay 16 of fuselage 10 of an aircraft 12, with each side portion 204 and 206 proximate a corresponding airframe member 28 or 30. In other words, frame structure 208 may be configured to have any suitable dimensions so that the frame structure may fit between opposing airframe members 28 and 30 of a forward interior bay 16 of any aircraft 12. In some embodiments, frame structure 208 may be substantially rectangular in shape. However, more generally, frame structures 208 may have any suitable shape, such as but not limited to rectangular, trapezoidal, hexagonal, cylindrical, etc. Additionally, frame structure 208 may consist of a material or mixture of materials suitable for use in aircraft 12, such as but not limited to metal, composite, epoxy, carbon fiber, wood, etc.

Side portions 204 and 206 of frame structure 208 may include at least one pair of mounting devices 202, more specifically mounting pins 210. Each mounting pin 210 may be disposed on and axially aligned with a respective one of opposing side portions 204 and 206 of frame structure 208, and configured to project outwardly from each respective side portion 204 and 206 to align with and detachably secure to the corresponding airframe member 28 or 30 when frame structure 208 is in a mounted position. For example, as shown in FIG. 1, embodiments may include two pairs of mounting pins 210 disposed on frame structure 208, including a first pair of mounting pins 210 spaced apart from a second pair of mounting pins 210. In addition to being configured for detachable securement to airframe members 28 and 30, mounting pins 210 may be configured to provide support for platform 200 on airframe members 28 and 30. Similar to frame structure 208, mounting pins 210 may consist of any material or mixture of materials suitable for use in aircraft 12.

Further, mounting pins 210 may be fixedly attached to frame structure 208 in any suitable way. For example, as shown in FIG. 1, in some embodiments, mounting pins 210 may include a mounting plate 211 having a plurality of small apertures 214 configured to enable insertion of bolts, screws, pins, etc. to thereby fasten mounting pins 210 to frame structure 208. Additionally or alternatively, mounting pins 210 may be glued, welded, etc. to frame structure 208. In other embodiments, mounting pins 210 may be a seamless component of frame structure 208, e.g., where frame structure 208 is additively manufactured. In general, each mounting pin 210 may be stationary, i.e., have a fixed position relative to frame structure 208. However, in some embodiments, mounting pins 210 may be nonstationary, i.e., have more than one position relative to frame structure 208. For simplicity, stationary pins are described as mounting pins, and nonstationary pins are described as pivot pins.

Some embodiments may include a pair of pivot pins 212, as indicated by phantom lines in FIG. 2. Pivot pins 212 may be another example of mounting devices 202 and provide additional support and/or securement for platform 200 on airframe members 28 and 30. Specifically, each pivot pin 212 may be disposed on and axially aligned with a respective side portion 204 or 206 of frame structure 208, spaced apart from mounting pin(s) 210 on each side portion 204 and 206, and positioned to align with a corresponding slot on a corresponding airframe member 28 or 30 when frame structure 208 is in a mounted position. Additionally, each pivot pin 212 may be configured to have a stowed position within a recessed area 213 of the respective side portion 204 or 206 of frame structure 208, and an extended position configured to extend into the corresponding slot on the corresponding airframe member 28 or 30 to thereby detachably secure frame structure 208 to airframe members 28 and 30. In some embodiments, the stowed position may be substantially parallel to or otherwise extend along an axis defined by a length of side portion 204 or 206. Pivot pins 212 are shown in FIG. 2 in their extended positions. Similar to frame structure 208 and mounting pins 210 and pivot pins 212 may consist of any material or mixture of materials suitable for use in aircraft 12. The mounting assemblies shown and described herein may be made according to designs known in the art as used on the existing custom reconnaissance assembly.

Additionally, as shown in FIG. 2, some embodiments may include a hoist element, such as a hoist ring or hoist knob 218 disposed on frame structure 208 of platform 200. Hoist knob 218 may generally be fixedly attached to frame structure 208 and include a structure configured to detachably secure to an external hoisting device suitable for lifting and/or lowering platform 200 within forward interior bay 16 of aircraft 12. For example, some embodiments may be configured to have an aperture through which a hook of the external hoisting device may be inserted; platform 200 may thus be positioned within forward interior bay 16 from outside of aircraft 12. Additionally, hoist knob 218 may be configured to enable the insertion and/or removal of platform 200 into and/or from forward interior bay 16, such as by raising and/or lowering platform 200 through access panel 44 (shown in FIG. 1).

Further, as shown in FIG. 2, some embodiments may include a connector assembly 220 disposed on frame structure 208 and having a plurality of connectors configured to connect equipment disposed on frame structure 208 to equipment disposed elsewhere in aircraft 12. For example, connector assembly 220 may include a 115-volt alternating current (AC) connector 222 configured to connect to 115-volt AC current source, a 28-volt direct current (DC) connector 224 configured to connect to a 28-volt DC current source, and a data bus connector 226 configured to connect to a data bus of aircraft 12. Connector assembly 208 may also include one or more additional connectors 228, as shown in FIG. 2. The additional connector(s) may connect any suitable equipment and perform any suitable function(s). Phantom lines have been drawn in FIG. 2 to indicate connector wires of aircraft 12 that may be attached to connector assembly 220. Additionally, although connector assembly 220 is disposed in FIG. 4 on a front portion of frame structure 208, connector assembly 220 may generally be disposed on any suitable portion of frame structure 208, such as but not limited to an equipment rack of frame structure 208.

Additionally, frame structure 208 may include at least one equipment rack having a plurality of equipment stations and configured to support and enable detachable securement of selected avionics equipment thereon. For example, as shown in FIG. 2, the at least one equipment rack may include a first equipment rack 230, and a second equipment rack 232 disposed below first equipment rack 230. Each equipment rack may be a shelf structure and include a substantially continuous floor or suitable configuration of floor members. However, as shown in FIG. 2, first equipment rack 230 may include a plurality of small apertures 234 configured to enable insertion of bolts, screws, pins, etc. to thereby fasten selected avionics equipment to first equipment rack 230. Additionally, first equipment rack 230 may include a plurality of larger apertures 236 configured to enable threading of wires, tubing, and/or other suitable equipment therethrough. Second equipment rack 232 may be substantially similar to first equipment rack 230.

Further, in some embodiments, first equipment rack 230 may include a first equipment station 238; and second equipment rack 232 may include a second equipment station 240 disposed above second equipment rack 232, and a third equipment station 242 disposed below second equipment rack 232. In some embodiments, third equipment station 242 may be a substantially open frame having a floor. Additionally, second equipment station 240 may be a substantially closed compartment. However, each equipment station may have any suitable configuration and/or positioning on frame structure 208. Additionally, although equipment stations are shown in FIG. 2 as partitioned areas of their respective equipment rack(s), embodiments may include any number of partitioned and/or non-partitioned equipment stations. For example, as shown in FIG. 2, first equipment rack 230 may include an additional fourth equipment station 244 on a side of partition 246 opposite first equipment station 238. Additionally, any suitable number of selected avionics equipment having any suitable dimensions may be disposed, either permanently or removably, within each equipment station.

For example, some embodiments may include an environmental cooling system, generally indicated at 248, included on and/or within platform 200 and configured to provide cooling air to an electronic device 250 disposed within platform 200. Environmental cooling system 248 may provide platform 200 with an internal system for cooling avionics equipment independent of an environmental cooling system of aircraft 12 in which platform 200 is mounted, thereby eliminating reliance on aircraft 12 for cooling and rerouting of aircraft environmental cooling system ducting to platform 200.

Specifically, FIG. 2 shows electronic device 250 disposed within second equipment station 232, and a compressor 252 and a cooling fan 254 of environmental cooling system 248 mounted in third equipment station 242. In some embodiments, compressor 252 may be a commercially available compressor that may connect to a 115-volt AC current source. Additionally, as shown in FIG. 2, environmental cooling system 248 may include a length of flexible cooling tubing 256 that is in fluid communication with cooling fan 254 and extends to second equipment station 240 to thereby supply cooling air to second equipment station 240. Environmental cooling system 248 may also include a length of flexible exhaust tubing 258 configured to conduct the heated cooling air for heat removal from second equipment station 232 to louvers 38 in forward interior bay 16 of fuselage 10 of aircraft 12 in which platform 200 is removably mounted (aircraft 12 shown in FIG. 1).

Other suitable avionics equipment may include, for example, any custom and/or commercial off-the-shelf devices such as cameras, data link systems, track and sensor systems, radio terminals, and/or other weapon replacement assemblies. Certain aspects of selected avionics equipment are described in more detail below.

Figure 3:
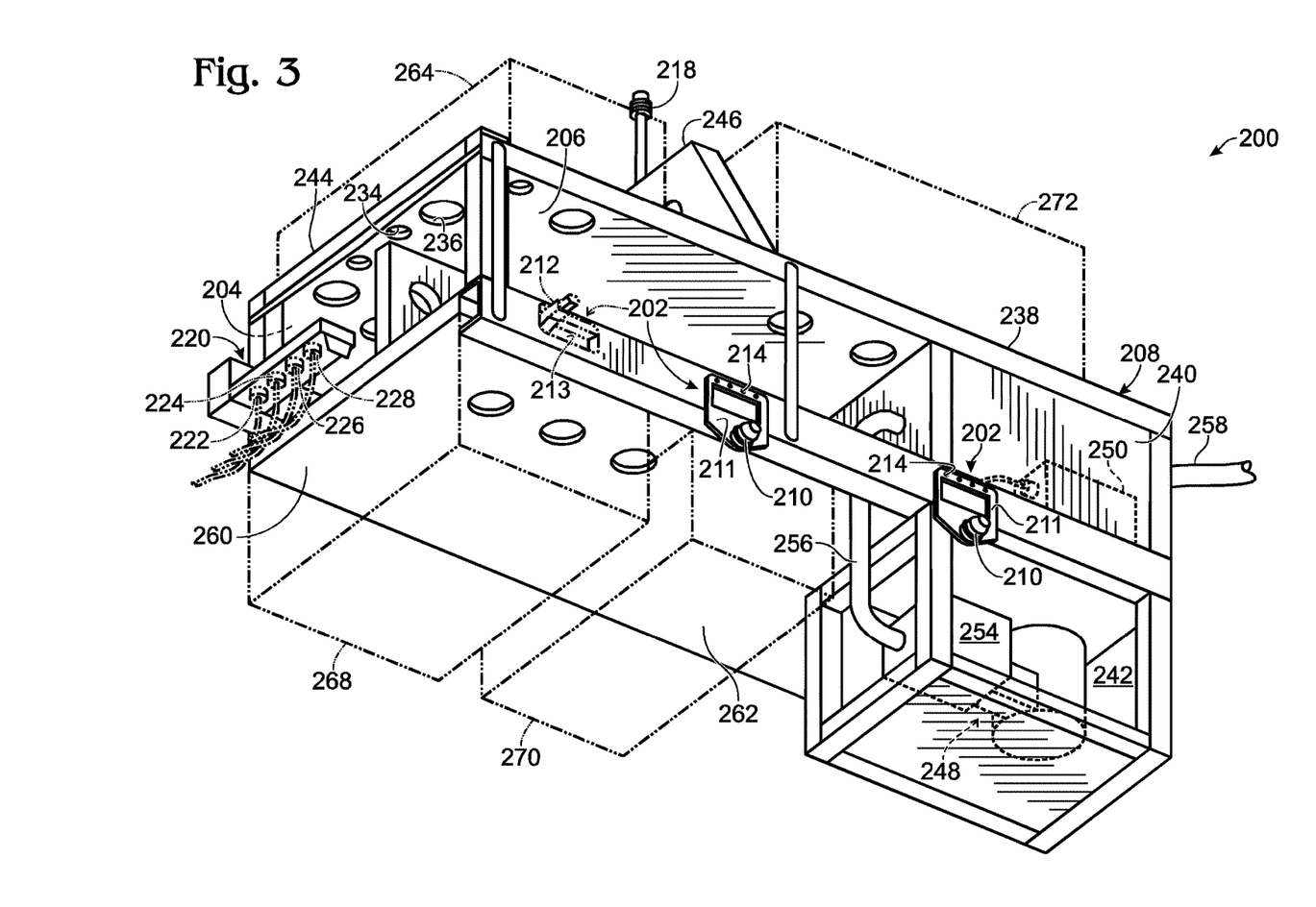
FIG. 3 is bottom isometric view showing the interchangeable modular avionics platform of FIG. 2.

FIG. 3 is bottom isometric view showing modular avionics platform 200 of FIG. 2, including phantom lines indicating areas of platform 200 where selected avionics equipment may be disposed. For simplicity, corresponding elements in the embodiment of FIG. 2 have been labeled using the same reference characters.

As shown in FIG. 3, some embodiments frame structure 208 may further include a fifth equipment station 260 and a sixth equipment station 262 in which additional avionics equipment may be disposed. Each equipment station may house any suitable avionics equipment having any suitable dimensions, not limited to the dimensions indicated by the phantom lines in FIG. 3.

For example, in some embodiments, fourth equipment station 244 may house a data link system 264 configured to sense and receive data communicated between aircraft communication nodes, to enable at least one airborne aircraft 12 to control firing of other airborne aircraft weaponry at a designated target by communicating using data link system 264. In some embodiments, fifth equipment station 260 may house a camera system 268 configured for use in reconnaissance missions. Additionally, in some embodiments, sixth equipment station 262 may house an infrared search-and-track sensor system 270 configured to enable tracking of other airborne aircraft. Further, in some embodiments, first equipment station 238 may house an internet-protocol-based mesh-network radio terminal 272 configured to enable data communication between multiple airborne aircraft including aircraft 12 in which platform 200 is removably mounted.

Additionally, these equipment may be housed in any suitable equipment station(s), and alternative embodiments may include alternate equipment. Equipment may be selected based on mission requirements. As discussed with respect to Example 1 above, selected equipment may be detachably secured to platform 200 and interchangeable with alternate equipment so that platform 200 may be used to perform a variety of equipment-dependent missions. Additionally or alternatively, selected equipment may be more permanently secured to platform 200 so that platform 200 may be interchangeable with a number of alternate platforms, each platform being configured to perform one or more specific equipment-dependent mission. In either case, platform 200 may be mountable within and non-destructively releasably removable from forward interior bay 16 of aircraft 12 in which platform 200 is mounted, to thereby enable modular installation of selected avionics equipment in aircraft 12 to perform a variety of equipment-dependent missions.

Figure 4:
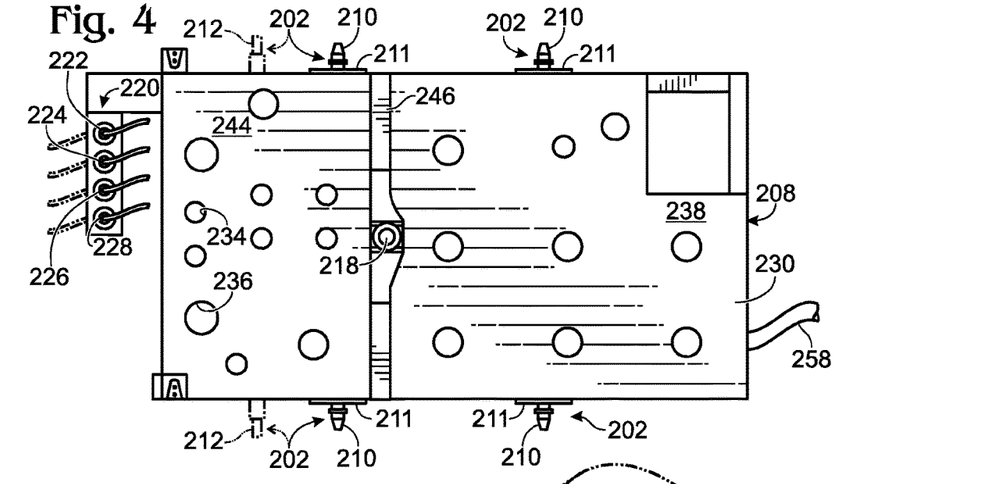
FIG. 4 is top view showing the interchangeable modular avionics platform of FIGS. 2-3.

FIG. 4 is top view showing the interchangeable modular avionics platform of FIGS. 2-3, including a clearer view of mounting pins 210 and pivot pins 212. For simplicity, corresponding elements in the embodiment of FIGS. 2-3 have been labeled using the same reference characters.

Although two pairs of mounting pins 210 are shown in FIG. 4, alternative embodiments may include any suitable number of mounting pins 210 disposed on frame structure 208, such as one pair of mounting pins 210 or more than two pairs of mounting pins 210. Additionally, as indicated by phantom lines in FIG. 4, embodiments may or may not include pivot pins 212. Pivot pins 212 are shown in FIG. 4 in their extended positions. Pivot pins 212 in their stowed positions may not be visible from the top view due to being stowed in recessed areas 213 (shown in FIGS. 2-3) of frame structure 208. Additionally, embodiments may in general include any suitable number and/or combination of mounting pins 210 and/or pivot pins 212. For example, some embodiments may include one pair of mounting pins 210 and one pair of pivot pins 212; other embodiments may include one pair of mounting pins 210 and two pairs of pivot pins 212; and yet other embodiments may include two pairs of mounting pins 210 and two pairs of pivot pins 212.

Additionally, some embodiments may include one or more pivot pins 212 configured to have substantially the same function as mounting pins 210, so long as the pivot pins are in their extended positions. More specifically, an extended pivot pin 212 may be configured to detachably secure to a corresponding clamp assembly in substantially the same way as a mounting pin 210. However as described further with reference to FIGS. 5 and 6, pivot pins 212 may generally be configured to detachably secure to corresponding slots in airframe members 28 and 30 within interior bay 16 of aircraft 12, whereas mounting pins 210 may generally be configured to detachably secure to corresponding clamp assemblies attached to airframe members 28 and 30 within interior bay 16 of aircraft 12. Clamp assemblies and slots are discussed in further detail below.

Figure 5:
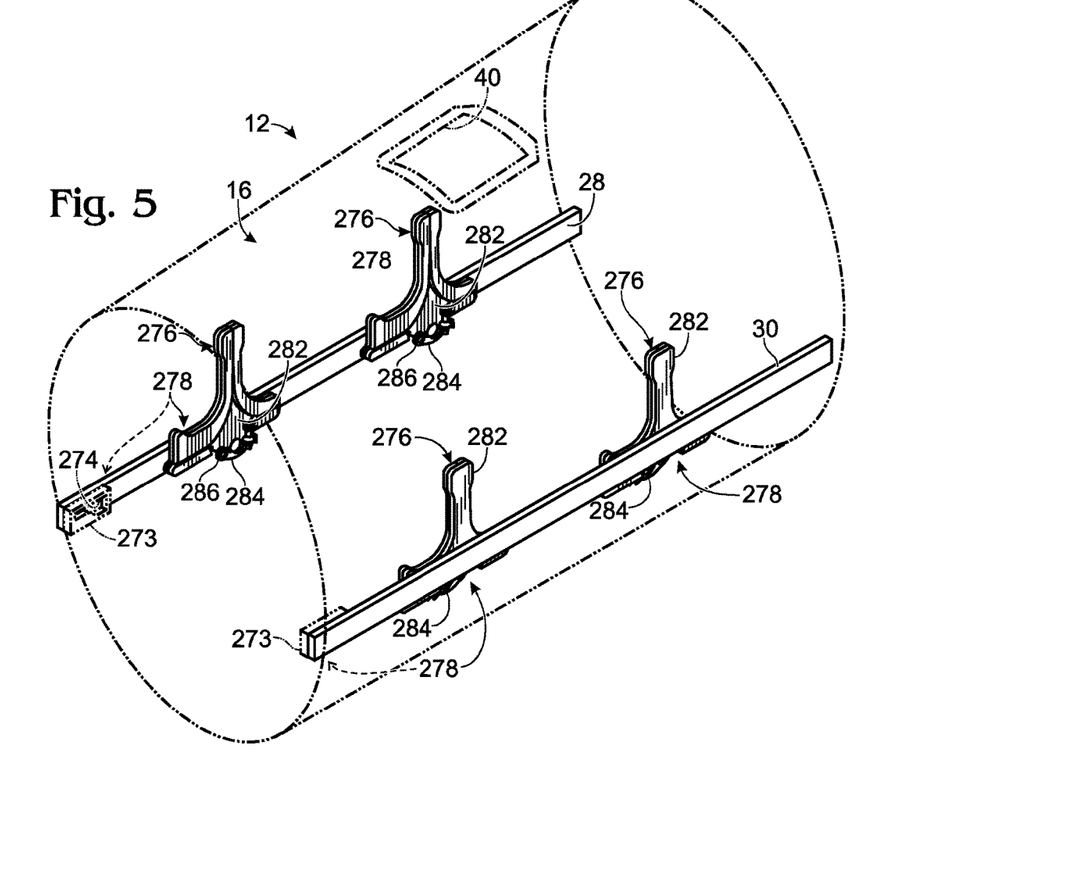
FIG. 5 is a partially transparent isometric view showing a cutaway portion of a forward interior bay of an aircraft, including a plurality of slot and clamp assemblies attached to opposing airframe members of the forward interior bay.

FIG. 5 is an isometric view showing a cutaway portion of a forward interior bay 16 of an aircraft 12, including a plurality of brackets 273 having slots 274 and clamp assemblies 276, as examples of second mounting devices 278 attached to opposing airframe members 28 and 30 of forward interior bay 16. Each second mounting device 278 may be configured to enable modular interchangeability of platform 200 with a number of alternate modular avionics platforms. Brackets 273, shown in phantom lines, may be an alternative to a clamp assembly 276, as described further below. For simplicity, corresponding elements in the embodiment of FIG. 1 have been labeled using the same reference characters. As shown in FIG. 5, embodiments may include a plurality of second mounting devices 278 disposed on airframe members 28 and 30 within forward interior bay 16. Second mounting devices 278 are complementary to and form mounting assemblies with mounting devices 202 disposed on frame structure 208 of platform 200. Mounting devices 202 are shown in FIGS. 2-4. As mentioned above, second mounting devices 278 may be made according to designs known in the art as used on the existing custom reconnaissance assembly.

Each clamp assembly 276 may be configured to be attached to an opposing airframe member 28 or 30 corresponding to each position of a corresponding mounting pin 210 disposed on frame structure 208 shown in FIGS. 2-4. Each mounting pin 210 may be configured to enable modular interchangeability of platform 200 with a number of alternate modular avionics platforms. Positions of mounting pins 210 relative to clamp assemblies 276 are indicated by phantom lines in FIG. 6. Each clamp assembly 276 may include a fixed clamp element 282 configured to be fixedly attached to opposing airframe member 28 or 30, and a pivot clamp element 284 configured to pivot between an open position in which pivot clamp element 284 is spaced apart from fixed clamp element 282, and a closed position in which pivot clamp element 284 is proximate to and secured relative to fixed clamp element 282 to thereby detachably secure corresponding mounting pin 210 to corresponding airframe member 28 or 30.

Fixed clamp elements 282 may be attached to airframe members 28 and 30 in any suitable way. For example, fixed clamp elements 282 may each include a plurality of small apertures configured to enable insertion of bolts, screws, pins, etc. to thereby fasten fixed clamp elements 282 to airframe members 28 and 30. Additionally or alternatively, fixed clamp elements 282 may be glued, welded, etc. to airframe members 28 and 30. Pivot clamp element 284 may also be attached to fixed clamp element 282 in any suitable way. For example, as shown in FIG. 5, each pivot clamp element 284 may be attached to fixed clamp element 282 using a hinge pin 286. Additionally, hinge pin 286 may allow pivot clamp element 284 to pivot between an open position, shown in phantom lines in FIG. 6, and a closed position, shown in solid lines in FIG. 6, relative to fixed clamp element 282. Similar to mounting pins 210, hinge pins 286 may consist of any material or mixture of materials suitable for use in aircraft 12, such as but not limited to metal, composite, epoxy, etc.

Although clamp assemblies 276 may generally be configured to detachably secure mounting pins 210, clamp assemblies 276 may additionally or alternatively support pivot pins 212 (shown in FIGS. 2-4) so long as each pivot pin 212 is in an extended position. Alternatively, pivot pins 212 may detachably secure to brackets 273 by pivoting into slots 274 in airframe members 28 and 30 when platform 200 is supported in position, such as by a hoist and/or due to additional mounting devices 202 on frame structure 208 being detachably secured to complementary second mounting devices 278 on airframe members 28 and 30. For example, in embodiments wherein mounting pins 210 are detachably secured to corresponding clamp assemblies 276 on airframe members 28 and 30, pivot pins 212 may be detachably secured to brackets 273 on airframe members 28 and 30 to provide additional support for platform 200 within forward interior bay 16 of aircraft 12.

Each bracket 273 may be attached to a corresponding airframe member 28 or 30 corresponding to a position of a corresponding pivot pin 212, and configured with slot 274 to detachably receive the corresponding pivot pin 212 in its extended position. Slot 274 may be any suitable shape and/or depth to receive and support pivot pin 212 therewithin.

Brackets 273 may be attached to airframe members 28 and 30 in any suitable way. For example, brackets 273 may each include a plurality of small apertures configured to enable insertion of bolts, screws, pins, etc. to thereby fasten brackets 273 to airframe members 28 and 30. Additionally or alternatively, brackets 273 may be configured to be glued, welded, etc. to airframe members 28 and 30. Further, brackets 273 may consist of any suitable material or mixture of materials, similar to clamp assemblies 276. However, some embodiments may not include any brackets 273. Embodiments not including brackets 273 may be, for example, embodiments wherein pivot pins 212 in their extended positions may be detachably secured using clamp assemblies 276. Mounting devices 202 may not include pivot pins 212 and airframe members 28 and 30 may include preexisting slots 274. Slots 274 may have a width corresponding to a length of pivot pins 212 so that pivot pins 212 may be pivoted into their extended positions within slots 274 to thereby be detachably secured within slots 274.

Figure 6:
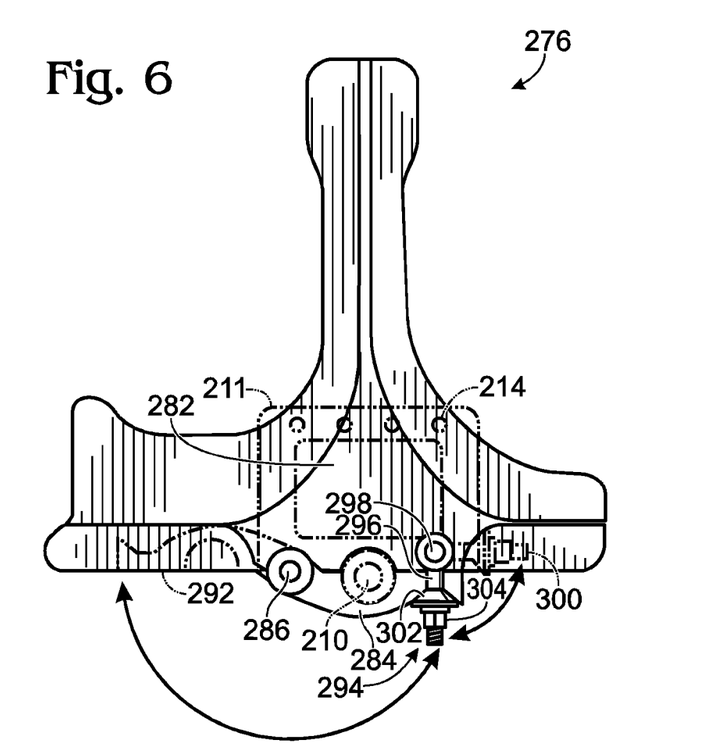
FIG. 6 is an enlarged view of the clamp assembly of FIG. 5, including a mounting pin secured within the clamp assembly.

FIG. 6 is an enlarged view showing in further detail clamp assembly 276 of FIG. 5, including a mounting pin 210 shown in phantom lines. As shown in FIG. 6, in some embodiments, clamp assembly 276 may include pivot clamp element 284 attached to fixed clamp element 282 by hinge pin 286. Specifically, pivot clamp element 284 may include an aperture configured to align with a corresponding aperture in fixed clamp element 282, wherein each aperture is configured to enable insertion of hinge pin 286 therethrough to thereby enable pivotal attachment of pivot clamp element 284 to fixed clamp element 282. Additionally, one or more ends of hinge pin 286 may be capped to prevent hinge pin 286 from falling out of either aperture. Further, pivot clamp element 284 may pivot around hinge pin 286 to an open position 292, as indicated by phantom lines in FIG. 6.

Additionally, pivot clamp element 284 may pivot around hinge pin 286 to a closed position proximate to and secured relative to fixed clamp element 282 to clamp corresponding mounting pin 210 to corresponding airframe member 28 or 30. As shown in FIG. 6, clamp assembly 276 may detachably secure mounting pin 210 when pivot clamp element 284 is in the closed position.

Further, as shown in FIG. 6, clamp assembly 276 may include a locking mechanism, generally indicated at 294, and configured to lock pivot clamp element 284 in place relative to clamp element 282 when pivot clamp element 284 is in the closed position. Locking mechanism 294 may include a locking member 296 configured to pivot around a second hinge pin 298 to an unlocked position 300, as indicated by phantom lines in FIG. 6, wherein locking member 296 does not lock pivot clamp element 284 in place relative to clamp assembly 276. Additionally, locking member 296 may be configured to pivot around second hinge pin 298 to a locked position, wherein locking member 296 may lock pivot clamp element 284 in the closed position.

Specifically, in some embodiments, locking mechanism 294 may include a ledge structure 302 disposed on locking member 296 and configured to lock pivot clamp element 284 in place relative to fixed clamp element 282. As shown in FIG. 6, ledge structure 302 may be configured to sit below a portion of pivot clamp element 284 and provide upward support for pivot clamp element 284 when pivot clamp element 284 is in the closed position and locking member 296 is in the locked position. Additionally, when pivot clamp element 284 is in the closed position and locking member 296 is in the locked position, ledge structure 302 may rest in a recess in pivot clamp element 284, thereby preventing pivot clamp element 284 from pivoting to the open position 292. Additionally, ledge structure 302 may be adjustable in position on locking member 296 between a raised position in which pivot clamp element 284 is locked in the closed position and a lowered position in which pivot locking member 296 is pivotable away from pivot claim element 284 to unlocked position 300.

In some embodiments, pivot locking member 296 may be a locking bolt on which ledge structure 302 is mounted. The position of ledge structure 302 on the locking bolt may then be manipulated by adjusting the position of a locknut 304 on the locking bolt. Adjustment of locknut 304 may raise and/or lower ledge structure 302 relative to second hinge pin 298 to thereby lock and/or unlock pivot clamp element 284. Accordingly, mounting pin 210 may be detachably secured relative to each clamp assembly 276 when mounting pin 210 is aligned within an aperture formed by clamp elements 282 and 284 of clamp assembly 276. For example, as shown in FIG. 6, clamp elements 282 and 284 may each include a semicircle-shaped aperture configured to form a circular aperture in which mounting pin 210 may be detachably secured when pivot clamp element 284 is in the closed position. Apertures formed by clamp elements 282 and 284 may have any shape and dimension suitable for detachably securing mounting pins 210.

In alternative embodiments, clamp assemblies 276 may include a fixed clamp element 282 and a movable clamp element 284 that is adjustable similar to the jaws of a conventional vise. Clamp assemblies 276 may consist of any material or mixture of materials suitable for use in aircraft 12, such as but not limited to metal, composite, epoxy, etc.

Methods for Removably Mounting Interchangeable Internal Avionics Platforms

Figure 7:
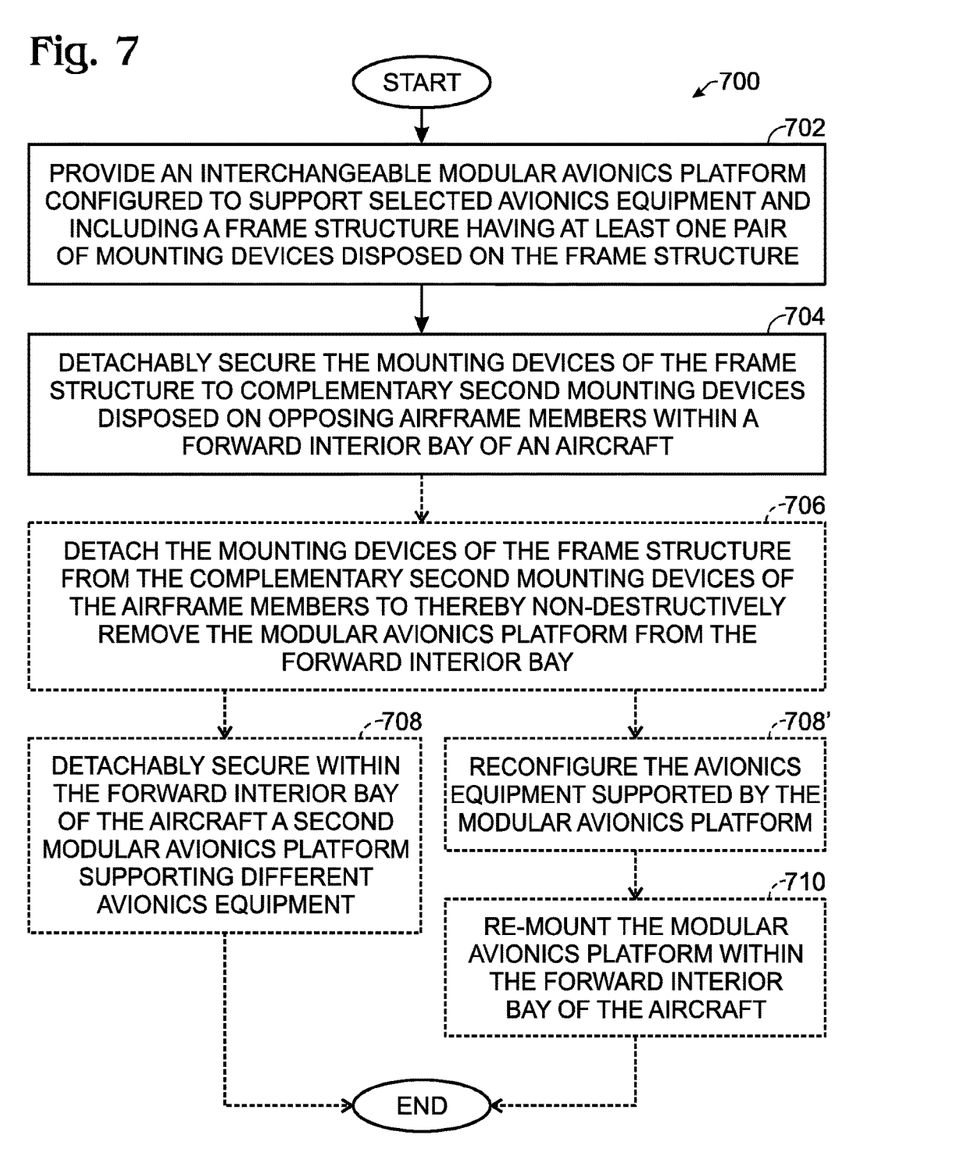
FIG. 7 is a flowchart depicting a method for removably mounting and interchanging an interchangeable modular avionics platform within a forward interior bay of an aircraft, and/or reconfiguring selected avionics equipment disposed on the modular avionics platform.

This section describes methods for removably mounting, interchanging, and/or reconfiguring internal avionics platforms; see FIG. 7.

Aspects of avionics platform assemblies may be utilized in the method steps described below. Where appropriate, reference may be made to previously described components and systems that may be used in carrying out each step. These references are for illustration, and are not intended to limit the possible ways of carrying out any particular step of the method. Although various steps are described below and depicted in FIG. 7, the steps need not necessarily all be performed, and in some cases may be performed in a different order than the order shown.

Example 2

FIG. 7 is a flowchart illustrating operations performed by an illustrative method and may not recite the complete process or all steps of the method. FIG. 7 depicts multiple steps of a method, generally indicated at 700. Specifically, method 700 may be a method for removably mounting an interchangeable modular avionics platform within a forward interior bay of an aircraft 12, interchanging the modular avionics platform with an alternate modular avionics platform, and/or reconfiguring the modular avionics platform. Embodiments of modular avionics platform assemblies are shown in FIGS. 2-6 and described in detail with respect to Example 1 above. For simplicity, corresponding elements in the embodiments of FIGS. 2-6 are described in Example 2 using the same reference characters.

A step 702 of method 700 may include providing an interchangeable modular avionics platform 200 configured to support selected avionics equipment having different dimensions. Platform 200 may include a frame structure 208 having substantially parallel opposing side portions 204 and 206 spaced apart at a predetermined width W so that frame structure 208 fits between opposing airframe members 28 and 30 within a forward interior bay 16 of a forward fuselage 10 of an aircraft 12, with each side portion 204 and 206 proximate a corresponding airframe member 28 or 30. In some embodiments, frame structure 208 may be manufactured to fit within a particular aircraft 12 and/or model of aircraft 12.

In some embodiments, frame structure 208 may be manufactured during step 702. For example, a user may obtain measurements of forward interior bay 16 and manufacture frame structure 208 to fit within forward interior bay 16. In other embodiments, frame structure 208 may be pre-manufactured and known to be suitable for aircraft 12 in which platform 200 is intended to be removably mounted. Additionally, in embodiments wherein frame structure 208 includes at least one equipment rack having a plurality of equipment stations, the equipment rack(s) and/or stations may be manufactured to fit a variety of selected avionics equipment thereupon and/or therein. For example, a user may configure a first equipment station 238 to have dimensions suitable for a camera. In that example, first equipment station 238 may be positioned on a lower portion of platform 200 and not include a floor, so that the camera may point downward to image elements below aircraft 12. Additionally, in some embodiments, equipment station 238 may have an open and/or partially open frame, solid and/or partially solid floor, etc. Additionally or alternatively, equipment rack(s) and stations may be pre-manufactured and have generic dimensions and/or configurations.

Some embodiments may include platform 200 having selected avionic equipment disposed on equipment rack(s) and configured to perform a specific mission or set of missions. For example, the avionics equipment may be pre-disposed on an equipment rack 230 and/or disposed on equipment rack 230 during step 702. The avionics equipment may be pre-disposed, partially pre-disposed, and/or disposed on equipment rack 230 during step 702. For example, platform 200 may be designated for use in reconnaissance missions and include pre-disposed avionics equipment suitable for reconnaissance missions. Alternatively, platform 200 may be more generic and include generic avionics equipment suitable for various missions, and/or one or more empty or partially empty equipment stations in which additional avionics equipment may be disposed, depending on mission requirements. Accordingly, selected avionics equipment may be disposed within the equipment station(s) during step 702.

Step 702 may also include providing at least one pair of mounting devices 202, each mounting device 202 disposed on and axially aligned with a respective one of opposing side portions 204 or 206 of frame structure 208 and configured to project outwardly from each respective opposing side portion 204 and 206 to align with and detachably secure to corresponding airframe member 28 or 30 when frame structure 208 is in a mounted position. In some embodiments, mounting devices 202 may be pre-disposed on frame structure 208. In other embodiments, mounting devices 202 may be disposed on frame structure 208 during step 702. In yet other embodiments, one or more mounting devices 202 may be pre-disposed on frame structure 208, and one or more additional mounting devices 202 may be disposed on frame structure 208 during step 702.

In embodiments wherein one or more mounting devices 202 are disposed on frame structure 208 during step 702, mounting device(s) 202 may be disposed on frame structure 208 with or without reference to corresponding areas of airframe members 28 and 30 where mounting device(s) 202 are to be detachably secured. For example, in embodiments wherein complementary second mounting devices 278 are pre-attached to airframe members 28 and 30, each mounting device 202 may be disposed on frame structure 208 in alignment with and detachably secured by a corresponding second mounting device 278 disposed on airframe member 28 or 30 when platform 200 is in the mounted position. Alternatively, mounting devices 202 may be disposed on frame structure 208 (before or during step 702) without reference to positions of any pre-attached second mounting devices 278. In such embodiments, second mounting devices 278 may be attached to airframe members 28 and 30 to correspond with positions of mounting devices 202 on frame structure 208 of platform 200. Additionally, some embodiments may include any number of mounting devices 202 that are pre-attached and/or attached during step 702.

A step 704 of method 700 may include detachably securing mounting devices 202 to airframe members 28 and 30 by aligning each mounting device 202 with the corresponding second mounting device 278, to thereby removably mount platform 200 within aircraft 12. Step 704 may include providing at least one pair of second mounting devices 278 disposed on airframe members 28 and 30 in positions corresponding to positions of mounting devices 202 on frame structure 208, each second mounting device 278 being configured to detachably secure a corresponding mounting device 202.

In some embodiments, second mounting devices 278 may be disposed on airframe members 28 and 30 prior to disposal of mounting devices 202 on frame structure 208. For example, aircraft 12 in which platform 200 is to be mounted may include second mounting devices 278 pre-disposed on airframe members 28 and 30 within forward interior bay 16, such as where aircraft 12 may be manufactured to have second mounting devices 278 within forward interior bay 16. In such embodiments, a user may not need to attach any second mounting devices 278 to airframe members 28 and 30. In alternative embodiments, as discussed above, one or more second mounting devices 278 may be disposed on airframe members 28 and/or 30 during step 704.

In embodiments wherein a number of second mounting devices 278 may be pre-disposed within forward interior bay 16, a user may nevertheless wish to attach one or more additional second mounting devices 278 to correspond with and support any additional mounting device(s) 202 that may be disposed on frame structure 208. Accordingly, a user may dispose one or more second mounting devices 278 on airframe members 28 and/or 30 during step 704. For example, an access panel 44 located on the bottom or side(s) of forward interior bay 16 may be opened to provide access to forward interior bay 16, wherein any suitable number of second mounting devices 278 may be disposed. Additionally, access panel 44 may provide access to forward interior bay 16 so that a user may make any necessary measurements, e.g., distance between opposing airframe members 28 and 30, positions of second mounting devices 278 disposed on airframe members 28 and 30, etc.

In embodiments wherein second mounting devices 278 include clamp assemblies 276, mounting devices 202 may be secured to airframe members 28 and 30 by pivoting a pivot clamp element 284 of each clamp assembly 276 to a closed position to thereby removably mount frame structure 208 within forward interior bay 16 of aircraft 12. Each pivot clamp element 284 may then be locked into place to thereby secure mounting devices 202 within clamp assemblies 276. In some embodiments, mounting devices 202 may be secured within clamp assemblies 276 similar to securing a device within a conventional vise; in other embodiments, mounting devices 202 may be secured within clamp assembly 276 by locking pivot clamp element 284 into place using a locking mechanism 294, described above with respect to Example 1. Detachably securing each mounting device 202 to the corresponding clamp assembly 276 thereby enables modular installation of selected avionics equipment into aircraft 12 to perform a variety of equipment-dependent missions.

In embodiments wherein second mounting devices 278 include slots 274, mounting devices 202 may include pivot pins 212 configured to detachably secure to airframe members 28 and 30 by extending into corresponding slots 274 in airframe members 28 and 30. Specifically, after aligning pivot pins 212 with corresponding slots 274, each pivot pin 212 may be pivoted into an extended position configured to extend into a corresponding slot 274 on airframe member 28 or 30 to thereby detachably secure frame structure 208 to airframe members 28 and 30. Embodiments may include any number, combination, and configuration of slots 274, clamp assemblies 276, pivot pins 212, and/or mounting pins 210.

In some embodiments, step 704 may include inserting platform 200 into forward interior bay 16 prior to detachably securing mounting devices 202 of frame structure 208 to corresponding second mounting devices 278 of airframe members 28 and 30. For example, platform 200 may be inserted into forward interior bay 16 through an access panel 44 on the bottom and/or side(s) of aircraft 12 where forward interior bay 16 is located. Additionally, platform 200 may be hoisted into forward interior bay 16 using a hoist knob 218 disposed on frame structure 208. Specifically, hoist knob 218 may be accessible through an access window 40 on an upper portion of forward interior bay 16, such as a gun mount upper access, and machinery or other suitable apparatus may attach to hoist knob 218 to raise and/or lower platform 200 within forward interior bay 16. Additionally, platform 200 may be positioned within forward interior bay 16 so that each mounting device 202 of frame structure 208 aligns with the corresponding second mounting device 278 attached to corresponding airframe member 28 or 30 of forward interior bay 16.

In some cases, a user may wish to remove platform 200 from forward interior bay 16 of aircraft 12. Accordingly, an optional step 706 of method 700 may include detaching mounting devices 202 of platform 200 from airframe members 28 and 30 to thereby non-destructively releasably remove platform 200 from forward interior bay 16. In embodiments wherein mounting devices 202 include clamp assemblies 276, mounting devices 202 may be detached from clamp assemblies 276 by pivoting pivot clamp element 284 of each clamp assembly 276 to an open position 292. In embodiments wherein mounting devices 202 include slots 274 and pivot pins 212, pivot pins 212 may be detached from slots 274 by pivoting each pivot pin 212 to a recessed position stowed within a recessed area 213 of a respective side portion 204 or 206 of frame structure 208.

In some embodiments, detachment of mounting devices 202 from second mounting devices 278 may be accomplished by first providing support for platform 200, such as by attaching hoist knob 218 to an external hoisting apparatus, so that mounting devices 202 may be released without causing platform 200 to fall. Platform 200 may then be removed from forward interior bay 16, such as by using the external hoisting apparatus to lower platform 200 through access panel 44 located on a bottom portion of forward interior bay 16.

A subsequent optional step 708 of method 700 may include interchanging platform 200 with an alternate second platform 200' configured to support an alternate set and/or configuration of selected avionics equipment. Second platform 200' may have substantially the same configuration as platform 200, but include different avionics equipment supported thereon or therein. Accordingly, corresponding elements of platform 200' are described using similar reference characters to platform 200, but with the numbers primed. Step 708 may include removably mounting platform 200' within forward interior bay 16 by detachably securing mounting devices 202' of second platform 200' to airframe members 28 and 30 in substantially the same way as detachably securing mounting devices 202 of platform 200 during step 704. Removable mounting and interchanging of platform 200 and platform 200' enables the modular installation of different avionics equipment into aircraft 12 to perform a variety of equipment-dependent missions.

In some embodiments, platform 200 may be reconfigured instead of interchanged with an alternate second platform 200'. Accordingly, an optional step 708' may be performed in lieu of step 708. Specifically, step 708' of method 700 may include reconfiguring the avionics equipment supported by platform 200' by rearranging, adding, and/or removing at least one piece of avionics equipment supported by platform 200. For example, one or more avionics devices may be removed and replaced with one or more alternate avionics devices so that platform 200 may be suitable for a different equipment-dependent mission or set of equipment-dependent missions.

A subsequent optional step 710 of method 700 may then include re-mounting platform 200 within forward interior bay 16 of aircraft 12 in substantially the same way as during step 704, to thereby modularly install different configurations, combinations, and/or sets of selected avionics equipment within aircraft 12 using the same platform 200.

To reiterate, certain steps of method 700 may be performed in any suitable order and/or combination. For example, in some embodiments, platform 200 may be reconfigured to support a different avionics equipment setup during step 708', remounted within aircraft 12 during step 710, unmounted from aircraft 12 in substantially the same way as during step 706, and then interchanged with platform 200' in substantially the same way as during step 708. In other words, method 700 may be performed in any manner suitable for modularly installing selected avionics equipment within aircraft 12 to perform a variety of equipment-dependent missions.

Additional Features of Interchangeable Internal Avionics Platform Assemblies

This section describes additional aspects and features of interchangeable internal avionics platform assemblies, presented without limitation as a series of paragraphs, some or all of which may be alphanumerically designated for clarity and efficiency. Each of these paragraphs can be combined with one or more other paragraphs, and/or with disclosure from elsewhere in this application in any suitable manner. Some of the paragraphs below expressly refer to and further limit other paragraphs, providing without limitation examples of some of the suitable combinations.

Example 3

A0. An interchangeable modular avionics platform assembly, comprising an interchangeable modular avionics platform including:
 a frame structure having substantially parallel opposing side portions spaced apart at a predetermined width so that the frame structure fits between opposing airframe members within a forward interior bay of a fuselage of an aircraft with each side portion proximate a corresponding airframe member;
 at least one pair of mounting pins, each mounting pin disposed on and axially aligned with a respective one of the opposing side portions of the frame structure and configured to project outwardly from each respective opposing side portion to align with and detachably secure to the corresponding airframe member when the frame structure is in a mounted position; and
 a connector assembly disposed on the frame structure and having a plurality of connectors, including an alternating current connector configured to connect to a 115-volt alternating current source, a direct current connector configured to connect to a 28-volt direct current source, and a data bus connector configured to connect to a data bus of the aircraft;
 wherein the modular avionics platform is mountable within and non-destructively releasably removable from the forward interior bay of the fuselage as to be interchangeable with a number of alternate modular avionics platforms, with each modular avionics platform being configured to support one or more of avionics equipment having different dimensions, and to thereby enable modular installation of selected avionics equipment into the aircraft to perform a variety of equipment-dependent missions.

A1. The interchangeable modular avionics platform assembly of paragraph A0, further comprising a clamp assembly configured to be attached to the opposing airframe member corresponding to each position of the mounting pins on the frame structure, each clamp assembly having a fixed clamp element configured to be fixedly attached to the airframe member, and a pivot clamp element configured to pivot between an open position in which the pivot clamp element is spaced apart from the fixed clamp element, and a closed position in which the pivot clamp element is proximate to and secured relative to the fixed clamp element to clamp the corresponding mounting pin to the corresponding airframe member and thereby enable removable mounting of the frame structure to the airframe members A2. The interchangeable modular avionics platform assembly of paragraph A0, wherein the at least one pair of mounting pins comprises a second pair of mounting pins spaced apart from the one pair of mounting pins, each pair of mounting pins configured to provide support for the platform on the airframe members.

A3. The interchangeable modular avionics platform assembly of paragraph A0, wherein the modular avionics platform further comprises a first equipment rack having first equipment station and configured to support and enable detachable securement of selected avionics equipment thereon, a second equipment rack having a second and third equipment stations, and an environmental cooling system, the environmental cooling system including a compressor and a cooling fan mounted in the third equipment station, and a length of flexible cooling tubing that is in fluid communication with the cooling fan and extends to the second equipment station to thereby supply cooling air to the second equipment station.

A4. The interchangeable modular avionics platform assembly of paragraph A3, wherein the environmental cooling system further comprises flexible exhaust tubing configured to communicate the cooling air for heat removal from the second equipment station to louvers in the forward interior bay of the fuselage for venting therethrough.

A5. The interchangeable modular avionics platform assembly of paragraph A0, wherein the modular avionics platform further comprises at least one equipment rack having a plurality of equipment stations configured to support and enable detachable securement of selected avionics equipment thereon.

A6. The interchangeable modular avionics platform assembly of paragraph A5, wherein the modular avionics platform further comprises a data link system disposed on the equipment rack and configured to sense and receive data communicated between aircraft communication nodes, to enable at least one airborne aircraft to control firing of other airborne aircraft weaponry at a designated target by communicating using the data link system.

A7. The interchangeable modular avionics platform assembly of paragraph A5, wherein the modular avionics platform further comprises an infrared search-and-track sensor system disposed on the equipment rack and configured to enable tracking of other airborne aircraft.

A8. The interchangeable modular avionics platform assembly of paragraph A5, wherein the modular avionics platform further comprises an internet-protocol-based mesh-network radio terminal disposed on the equipment rack and configured to enable data communication between multiple airborne aircraft including the aircraft in which the modular avionics platform is mounted.

A9. The interchangeable modular avionics platform assembly of paragraph A0, wherein the modular avionics platform further comprises a pair of pivot pins, each pivot disposed on and axially aligned with a respective one of the opposing side portions of the frame structure and positioned to align with a corresponding slot on the corresponding airframe member when the frame structure is in a mounted position, and configured to have a stowed position recessed within the respective side portion of the frame structure, and an extended position configured to extend into the corresponding slot on the opposing airframe member to thereby detachably secure the frame structure to the airframe members.

A10. The interchangeable modular avionics platform assembly of paragraph A0, wherein the frame structure includes first and second equipment racks with the first equipment rack disposed above the second equipment rack.

B0. An aircraft comprising:
  a forward interior bay of a fuselage of the aircraft having laterally opposing airframe members and configured for removable mounting of a gun therein;
  an interchangeable modular avionics platform removably mounted to the airframe members within the forward interior bay, wherein the platform includes a substantially rectangular frame structure having opposing side portions proximate to the airframe members, and wherein the frame structure includes a plurality of outwardly projecting mounting pins disposed on and axially aligned with the side portions, including a first pair of mounting pins and a second pair of mounting pins spaced apart from the first pair of mounting pins, each mounting pin positioned on the frame structure to align with and detachably secure to a corresponding clamp assembly disposed on the airframe members; and
  a plurality of clamp assemblies disposed on the airframe members in positions corresponding to positions of the mounting pins on the frame structure, including a first pair of clamp assemblies corresponding to the first pair of mounting pins and a second pair of clamp assemblies corresponding to the second pair of mounting pins, each clamp assembly configured to detachably secure a corresponding mounting pin and having a fixed clamp element fixedly attached to a respective airframe member, and a pivot clamp element configured to pivot between an open position in which the corresponding mounting pin is not clamped, and a closed position in which the corresponding mounting pin is clamped into place relative to the clamp assembly;
  the modular avionics platform being configured to be mountable within and non-destructively releasably removable from the forward interior bay of the fuselage by the plurality of clamp assemblies as to be interchangeable with a number of alternate modular avionics platforms, with each modular avionics platform being configured to support one or more of avionics equipment having different dimensions, and to thereby enable modular installation of selected avionics equipment into the aircraft to perform a variety of equipment-dependent missions.

B1. The aircraft of paragraph B0, wherein the modular avionics platform further comprises a connector assembly disposed on the frame structure and having a plurality of connectors, including an alternating current connector configured to connect to a 115-volt alternating current source, a direct current connector configured to connect to a 28-volt direct current source, and a data bus connector configured to connect to a data bus of the aircraft.

B2. The aircraft of paragraph B0, wherein the modular avionics platform further comprises at least one equipment rack supported on the frame structure and having a plurality of equipment stations, including a first equipment station and a second equipment station, each equipment station being configured to support and enable detachable securement of selected avionics equipment therein.

B3. The aircraft of paragraph B2, wherein the modular avionics platform further comprises a third equipment station supported on the frame structure and an environmental cooling system including a compressor and cooling fan supported in the third equipment station, and a length of flexible cooling tubing in fluid communication with the cooling fan and configured to extend to the second equipment station to thereby supply cooling air to at least one electrical component disposed within the second equipment station.

B4. The aircraft of paragraph B3, wherein the environmental cooling system further comprises flexible exhaust tubing configured to communicate the cooling air for heat removal from the second equipment station to louvers in the forward interior bay of the fuselage for venting therethrough.

B5. The aircraft of paragraph B2, wherein the modular avionics platform further comprises a data link system disposed on the equipment rack and configured to sense and receive data communicated between aircraft communication nodes, and to enable at least one airborne aircraft to control firing of other airborne aircraft weaponry at a designated target by communicating using the data link system.

B6. The aircraft of paragraph B2, wherein the modular avionics platform further comprises an infrared search-and-track sensor system disposed on the equipment rack and configured to enable tracking of other airborne aircraft.

B7. The aircraft of paragraph B2, wherein the modular avionics platform further comprises an internet-protocol-based mesh-network radio terminal disposed on the equipment rack and configured to enable data communication between multiple airborne aircraft including the aircraft in which the modular avionics platform is mounted.

C0. A method for removably mounting an interchangeable modular avionics platform within a forward interior bay of a fuselage of an aircraft, comprising:
  providing an interchangeable modular avionics platform configured to support selected avionics equipment having different dimensions, and including a frame structure having substantially parallel opposing side portions spaced apart at a predetermined width so that the frame structure fits between opposing airframe members within the forward interior bay of the aircraft with each side portion proximate a corresponding airframe member;
  providing at least one pair of first mounting devices, each first mounting device disposed on and axially aligned with a respective one of the opposing side portions of the frame structure and configured to project outwardly from each respective opposing side portion to align with and detachably secure to the corresponding airframe member when the frame structure is in a mounted position;
  providing at least one pair of complementary second mounting devices disposed on the airframe members in positions corresponding to positions of the first mounting devices on the frame structure, each second mounting device configured to detachably secure a corresponding first mounting device and having a fixed clamp element fixedly attached to a respective airframe member, and a pivot clamp element configured to pivot between an open position in which the corresponding first mounting device is not clamped, and a closed position in which the corresponding first mounting device is clamped into place relative to the second mounting device;

detachably securing the first mounting devices of the frame structure to the airframe members by aligning each first mounting device with a corresponding second mounting device and pivoting the pivot clamp element of each second mounting device to the closed position to thereby removably mount the frame structure within the forward interior bay of the fuselage as to be interchangeable with a number of alternate modular avionics platforms, thus enabling modular installation of selected avionics equipment into the aircraft to perform a variety of equipment-dependent missions.

C1. The method of paragraph C0, further comprising non-destructively releasing the frame structure from the airframe members within the forward interior bay of the fuselage by pivoting the pivot clamp element of each second mounting device to the open position to unclamp the corresponding first mounting device and thereby enable removal of the modular avionics platform from the aircraft.

C2. The method of paragraph C1, further comprising providing and removably mounting an alternate modular avionics platform within the forward interior bay of the fuselage, wherein the alternate modular avionics platform is configured to support alternate avionics equipment, to thereby modularly install different avionics equipment within the aircraft.

C3. The method of paragraph C1, further comprising reconfiguring the avionics equipment supported by the modular avionics platform by at least one of rearranging, adding, and removing at least one piece of avionics equipment supported by the modular avionics platform.

C4. The method of paragraph C3, further comprising re-mounting the modular avionics platform within the forward interior bay of the fuselage to thereby modularly install different configurations of selected avionics equipment within the aircraft.

Advantages, Features, Benefits

The different embodiments of the interchangeable internal modular avionics platform assembly described herein provide several benefits. For example, the illustrative embodiments of modular avionics platform assemblies described herein allow for selected avionics equipment to be removably mounted within an interior bay of any aircraft, thereby increasing external stores capability of the aircraft. Additionally, and among other benefits, illustrative embodiments of the modular avionics platform assembly described herein may allow for the easy installation, removal, and interchanging of various modular avionics platforms within the aircraft, thereby enabling modular installation of avionics equipment into the aircraft to perform a variety of equipment-dependent missions. Thus, the illustrative embodiments described herein are particularly useful for situations requiring a high degree of modularity. However, not all embodiments described herein provide the same benefits or the same amount of benefit.

Conclusion

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

I claim:

1. A method of mounting avionics equipment in an aircraft, comprising:
   connecting two or more of a plurality of avionics equipment having different dimensions to a modular avionics platform assembly having:
      a frame structure with substantially parallel, opposing, and spaced apart side portions; and
      a pair of mounting pins disposed on and axially aligned with the opposing side portions of the frame structure, and configured to project outwardly from the frame structure;
   connecting a first selected one of the plurality of avionics equipment to a first equipment station of an equipment rack of the modular avionics platform assembly;
   connecting a second selected one of the plurality of avionics equipment to a second equipment station of the equipment rack;
   positioning the modular avionics platform assembly in a forward interior bay of a fuselage of the aircraft such that each of the side portions of the frame structure is proximate a corresponding one of a pair of opposing airframe members of the fuselage;
   aligning each of the pair of mounting pins with the corresponding one of the pair of opposing airframe members;
   detachably securing each of the pair of mounting pins to the corresponding one of the pair of opposing airframe members to support the modular avionics platform assembly; and
   supplying cooling air to the second equipment station with an environmental cooling system mounted in a third equipment station of the equipment rack and having:
      a compressor;
      a cooling fan; and
      a length of flexible cooling tubing that is in fluid communication with the cooling fan and extends to the second equipment station.

2. The method of claim 1, further including removing heat from the second equipment station by communicating the supplied cooling air through a flexible exhaust tubing and venting the communicated cooling air out of louvers in the forward interior bay of the fuselage.

3. The method of claim 1, wherein the detachably securing each of the pair of mounting pins includes pivoting a pivot clamp element of a clamp assembly attached to the corresponding one of the pair of opposing airframe members from an open position in which the pivot clamp element is spaced apart from a fixed clamp element of the clamp assembly and a closed position in which the pivot clamp element is proximate to and secured relative to the fixed clamp element in order to clamp a mounting pin of the pair of mounting pins.

4. The method of claim 3, further including:
aligning each of a second pair of mounting pins with a corresponding second clamp assembly attached to the corresponding one of the pair of opposing airframe members, wherein the second pair of mounting pins is spaced from the first pair of mounting pins; and
detachably securing each of the second pair of mounting pins with the corresponding second clamp assembly.

5. The method of claim 1, wherein the detachably securing each of the pair of mounting pins includes pivoting a mounting pin of the pair of mounting pins from a stowed position recessed within a respective one of the side portions of the frame structure to an extended position extending into a slot on the corresponding one of the pair of opposing airframe members.

6. The method of claim 1, wherein the connecting two or more of a plurality of avionics equipment includes connecting the first selected one and the second selected one of the plurality of avionics equipment to a connector assembly of the modular avionics platform, the connector assembly including:
an alternating current connector configured to connect to a 115-volt alternating current source;
a direct current connector configured to connect to a 28-volt direct current source; and
a data bus connector configured to connect to a data bus of the aircraft.

7. The method of claim 1, further including:
detaching each of the pair of mounting pins from the corresponding one of the pair of opposing airframe members;
removing the modular avionics platform assembly from the aircraft;
disconnecting the two or more of the plurality of avionics equipment;
connecting one or more other equipment of the plurality of avionics equipment to the modular avionics platform assembly; and
re-positioning the modular avionics platform assembly in the forward interior bay of the fuselage of the aircraft; and
re-securing each of the pair of mounting pins to the corresponding one of the pair of opposing airframe members.

8. The method of claim 1, further including:
detaching each of the pair of mounting pins from the corresponding one of the pair of opposing airframe members;
removing the modular avionics platform assembly from the aircraft;
connecting one or more other equipment of the plurality of avionics equipment to an alternate modular avionics platform assembly;
positioning the alternate modular avionics platform assembly in the forward interior bay of the fuselage of the aircraft; and
securing each of a pair of mounting pins of the alternative modular avionics platform assembly to the corresponding one of the pair of opposing airframe members.

9. A method of mounting a modular avionics platform assembly in a forward interior bay of a fuselage of an aircraft, comprising:
connecting a plurality of avionics equipment having different dimensions to the modular avionics platform assembly including a plurality of interchangeable modular avionics platforms, each of the interchangeable modular avionics platforms having:
a frame structure with substantially parallel, opposing, and spaced apart side portions;
a plurality of mounting pins disposed on and axially aligned with the opposing side portions of the frame structure, and configured to project outwardly from the frame structure; and
a connector assembly including an alternating current connector configured to connect to a 115-volt alternating current source, a direct current connector configured to connect to a 28-volt direct current source, and a data bus connector configured to connect to a data bus of the aircraft;
selecting a first one of the interchangeable modular avionics platforms with the connected avionics equipment appropriate to an equipment-dependent mission of the aircraft;
positioning the first one of the interchangeable modular avionics platforms in the forward interior bay of the fuselage of the aircraft such that each of the side portions of the frame structure is proximate a corresponding one of a pair of opposing airframe members of the fuselage;
aligning each of the mounting pins with a corresponding clamp assembly attached to the corresponding one of the pair of opposing airframe members;
detachably clamping each of the mounting pins to the corresponding clamp assembly by pivoting a pivot clamp element of the corresponding clamp assembly from an open position in which the pivot clamp element is spaced apart from a fixed clamp element of the corresponding clamp assembly and a closed position in which the pivot clamp element is proximate to and secured relative to the fixed clamp element.

10. The method of claim 9, further including tracking airborne aircraft with an infrared search-and-track sensor system connected to the first one of the interchangeable modular avionics platforms.

11. The method of claim 9, further including communicating data between at least one airborne aircraft and an airborne aircraft weaponry system with a data link system connected to the first one of the interchangeable modular avionics platforms, to enable the at least one airborne aircraft to control firing of the airborne aircraft weaponry system at a designated target.

12. The method of claim 9, further including communicating data between multiple airborne aircraft including the aircraft in which the modular avionics platform assembly is mounted, with an internet-protocol-based mesh-network radio terminal connected to the first one of the interchangeable modular avionics platforms.

13. The method of claim 9, further including:
- detaching the first one of the interchangeable modular avionics platforms;
- selecting a second one of the interchangeable modular avionics platforms with the connected avionics equipment appropriate to another equipment-dependent mission of the aircraft;
- positioning the second one of the interchangeable modular avionics platforms in the forward interior bay of the fuselage of the aircraft such that each of the side portions of the frame structure is proximate the corresponding one of the pair of opposing airframe members of the fuselage;
- aligning each of the mounting pins of the second one of the interchangeable modular avionics platforms with the corresponding clamp assembly attached to the corresponding one of the pair of opposing airframe members; and
- detachably clamping each of the mounting pins of the second one of the interchangeable modular avionics platforms to the corresponding clamp assembly.

14. A method for removably mounting an interchangeable modular avionics platform within a forward interior bay of a fuselage of an aircraft, comprising:
- providing an interchangeable modular avionics platform configured to support selected avionics equipment having different dimensions, and including a frame structure having substantially parallel opposing side portions spaced apart at a predetermined width so that the frame structure fits between opposing airframe members within the forward interior bay of the aircraft with each of the side portions proximate a corresponding one of the opposing airframe members;
- providing at least one pair of first mounting devices, each of the first mounting devices disposed on and axially aligned with a respective one of the opposing side portions of the frame structure and configured to project outwardly from each respective one of the opposing side portions to align with and detachably secure to the corresponding one of the opposing airframe members when the frame structure is in a mounted position;
- providing at least one pair of complementary second mounting devices disposed on the opposing airframe members in positions corresponding to positions of the first mounting devices on the frame structure, each of the second mounting devices configured to detachably secure a corresponding one of the first mounting devices and having a fixed clamp element fixedly attached to the corresponding one of the opposing airframe members, and a pivot clamp element configured to pivot between an open position in which the corresponding one of the first mounting devices is not clamped, and a closed position in which the corresponding one of the first mounting devices is clamped into place relative to a corresponding one of the second mounting devices; and
- detachably securing the first mounting devices of the frame structure to the opposing airframe members by aligning each of the first mounting devices with the corresponding one of second mounting devices and pivoting the pivot clamp element of each of the second mounting devices to the closed position to thereby removably mount the frame structure.

15. The method of claim 14, further comprising non-destructively releasing the frame structure from the opposing airframe members within the forward interior bay of the fuselage by pivoting the pivot clamp element of each of the second mounting devices to the open position to unclamp the corresponding one of the first mounting devices and thereby enable removal of the modular avionics platform from the aircraft.

16. The method of claim 15, further comprising providing and removably mounting an alternate modular avionics platform within the forward interior bay of the fuselage, wherein the alternate modular avionics platform is configured to support alternate ones of the selected avionics equipment, to thereby modularly install the alternate ones of the selected avionics equipment within the aircraft.

17. The method of claim 15, further comprising reconfiguring the selected avionics equipment supported by the modular avionics platform by at least one of rearranging, adding, and removing at least one piece of the selected avionics equipment supported by the modular avionics platform.

18. The method of claim 17, further comprising re-mounting the modular avionics platform within the forward interior bay of the fuselage to thereby modularly install different configurations of the selected avionics equipment within the aircraft.

* * * * *